United States Patent [19]
McPartland

[11] Patent Number: 5,534,797
[45] Date of Patent: Jul. 9, 1996

[54] COMPACT AND FAST ROW DRIVER/DECODER FOR SEMICONDUCTOR MEMORY

[75] Inventor: Richard J. McPartland, Nazareth, Pa.

[73] Assignee: AT&T Corp., Murray Hill, N.J.

[21] Appl. No.: 363,046

[22] Filed: Dec. 23, 1994

[51] Int. Cl.$^6$ ............................................. H03K 19/017
[52] U.S. Cl. .................... 326/105; 326/108; 365/230.06; 365/203
[58] Field of Search ..................... 326/106, 108; 365/203, 230.06

[56] References Cited

U.S. PATENT DOCUMENTS

| | | | |
|---|---|---|---|
| 4,618,784 | 10/1986 | Chappell | 365/230.06 |
| 4,788,457 | 11/1988 | Mashiko | 365/230.06 |
| 4,827,160 | 5/1989 | Okano | 326/108 |
| 5,018,107 | 5/1991 | Yoshida | 365/230.06 |

*Primary Examiner*—Edward P. Westin
*Assistant Examiner*—Andrew Sanders
*Attorney, Agent, or Firm*—David L. Smith

[57] ABSTRACT

The integrated circuit includes a plurality of row decoder-driver circuits, each for raising the voltage of a respective row line. Each of the plurality of row decoder-driver circuits includes an address decoder capable of receiving a plurality of address bits. The plurality of address bits, when decoded, identify one of the plurality of row decoder-drivers to provide an output. Each of the plurality of row decoder-drivers has an input transistor having a gate. The input transistor has a conduction path coupled between a power supply node and the address decoder. A signal generating circuit receives a signal to raise the voltage of a respective row line associated with the identified row decoder-driver circuit. The signal generating circuit provides an output that is coupled to the gate of the input transistor of each of the plurality of row decoder-driver circuits. The signal generating circuit output maintains the gate voltage of each of the input transistors near the edge of conduction when receiving the signal that the voltage of the respective row line is to be raised. Otherwise the signal generating circuit maintains the gate voltage at ground potential.

4 Claims, 3 Drawing Sheets

RD1

20

COMPACT AND FAST ROW DRIVER/DECODER FOR SEMICONDUCTOR MEMORY

TECHNICAL FIELD

This invention relates to semiconductor memory devices and in particular to row driver-decoder circuits for decoding the row address and raising and lowering the voltage of the addressed row within a memory array.

BACKGROUND OF THE INVENTION

Driver-decoder circuits are part of an integrated circuit that incorporates a memory. The memory typically includes an array of memory cells. A memory cell is activated by selecting its row line and raising the voltage of the row line while transferring data to or from its column line. A row address, typically binary, is presented to the memory circuit. During the precharge portion of a read or write cycle, the row driver-decoder circuit maintains all row lines at ground potential. The row driver-decoder circuit raises the voltage of an addressed row from ground potential to a non-ground potential, such as VDD, during the active portion of a read or write cycle. The row driver-decoder circuits maintain all non-addressed rows at ground potential during the active portion of the cycle. As memories increase in size, that is as memories incorporate more and more memory cells, address decoding and driver circuits become more complex, requiring more space and more time to decode an address. Speed improvements in the decoding circuits are desirable. As integrated circuits are manufactured using smaller and smaller line widths, the area available for row driver-decoder circuits is reduced. The row driver-decoder circuit is fabricated on the same pitch spacing as the row that is being decoded. In laying-out the row driver-decoder circuits on-pitch, the space constraints preclude some circuit designs.

In the prior art, a row decoder-driver circuit included a P-channel transistor that had its source connected to power supply VDD, and its gate grounded, thereby being maintained in an on state. In the on state and in the absence of any pulldown on the drain, the drain of the P-channel transistor was maintained in a logic high. When the appropriate address was received, the drain of the P-channel transistor was coupled to ground and pulled low at the rate which would discharge the capacitance associated with the node. However, node discharge was inhibited by the P-channel transistor continuing to be in the conductive state, thereby electrically coupling the node to VDD. The continuous P-channel transistor conduction resulted in relatively slow discharge of the capacitance associated with the node. In turn the rate of transition of a selected row line from ground potential to non-ground potential was relatively slow. In order to overcome the continuous P-channel transistor conduction, the gain of the transistor or transistors coupling the drain of the P-channel transistor to ground must be substantially greater than the gain of the P-channel transistor. This increases the nodal capacitance of the drain of the P-channel transistor and substantially increases the time necessary to precharge the node-to-VDD potential when any transistors coupling this node to ground are switched to the nonconductive state. As a result, the rate of transition of a selected row from VDD to ground was relatively slow. What is needed is a technique to rapidly charge and discharge the capacitance, and in turn rapidly transition the row line from ground potential to a non-ground potential or to rapidly transition from a non-ground potential to ground potential.

SUMMARY OF THE INVENTION

In accordance with an illustrative embodiment of the present invention, an integrated circuit includes a plurality of row decoder-driver circuits, each for raising the voltage of a respective row line. Each of the plurality of row decoder-driver circuits includes an address decoder capable of receiving a plurality of address bits. The plurality of address bits, when decoded, identify one of the plurality of row decoder-drivers to provide an output. Each of the plurality of row decoder-drivers has an input transistor having a gate. The input transistor has a conduction path coupled between a power supply node and the address decoder. A signal generating circuit receives a signal to raise the voltage of a respective row line associated with the identified row decoder-driver circuit. The signal generating circuit provides an output that is coupled to the gate of the input transistor of each of the plurality of row decoder-driver circuits. The signal generating circuit output maintains the gate voltage of each of the input transistors near the edge of conduction when receiving the signal that the voltage of the respective row line is to be raised. Otherwise the signal generating circuit maintains the gate voltages at ground potential.

DETAILED DESCRIPTION

Figure 1:
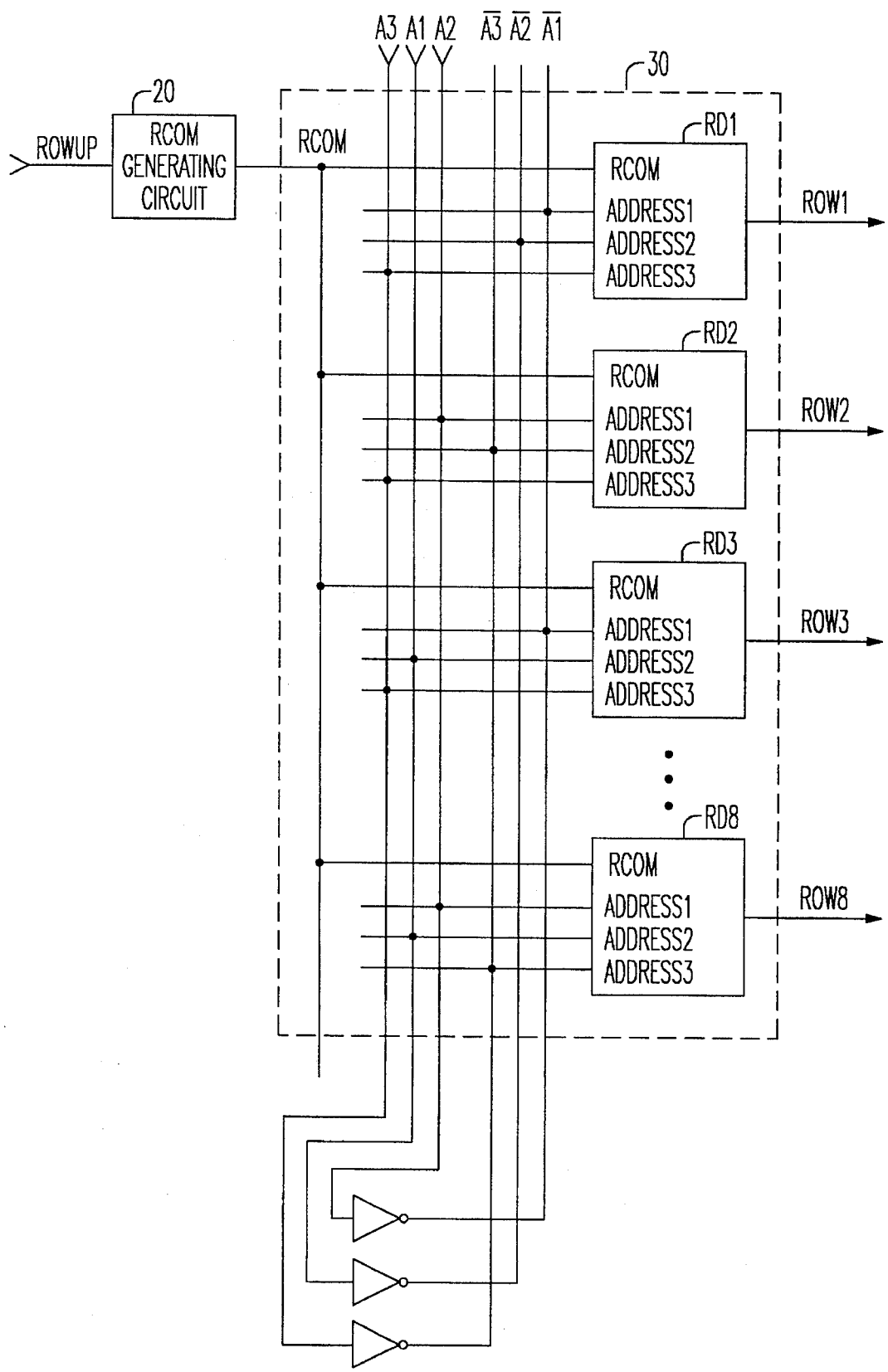
FIG. 1 is a block diagram of a portion of a row decoder-driver circuit of an integrated circuit in accordance with an illustrative embodiment of the invention.

FIG. 1 shows a block diagram of a unit of eight row driver-decoders RD1 through RD8. Each row driver-decoder RD1 through RD8 receives an RCOM signal, as discussed in greater detail below, and three address bits ADDRESS 1, ADDRESS2, and ADDRESS3 selected from bits A3, A2 and A1, and their complements. Some precoding of a row address is accomplished prior to the three address bits being provided to the circuit of FIG. 1. Three address bits provide for one-of-eight row selection. The eight row driver-decoder circuits of FIG. 1 are replicated in each of 64 units for a memory of 512 rows. A common RCOM signal is provided to all 64 units of eight row drivers. Other configurations are possible.

Figure 2:
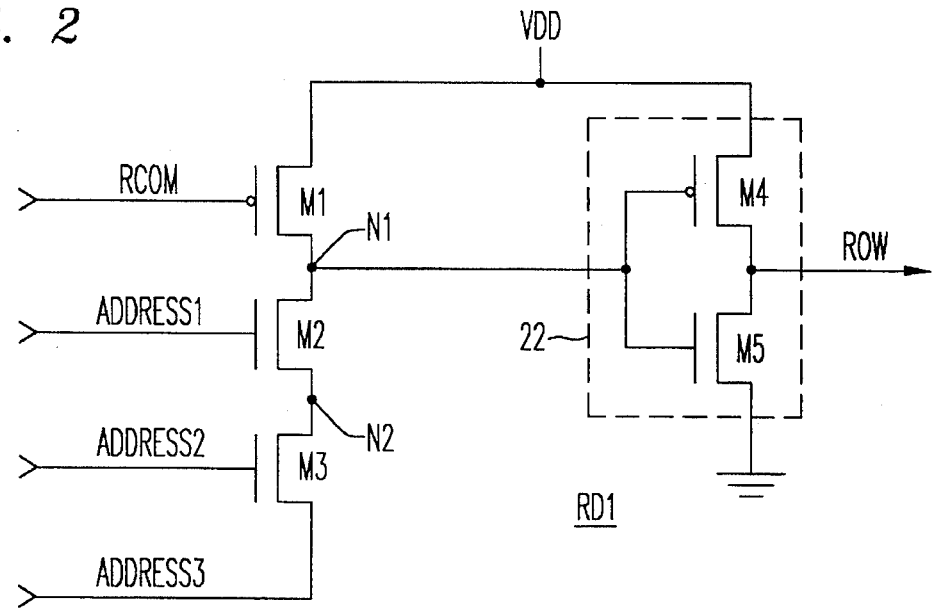
FIG. 2 is a schematic diagram of a row decoder-driver circuit shown in FIG. 1.

A schematic diagram of an illustrative embodiment row driver-decoder RD1 is shown in FIG. 2 in which transistors M1 and M4 are P-channel transistors, and transistors M2, M3, and M5 are N-channel transistors. For illustrative purposes, the threshold voltage drop of P-channel and N-channel transistors are assumed to be identical, though they need not be identical. The conduction path of transistors M1, M2 and M3 are electrically coupled between the power supply terminal, VDD, and ADDRESS3. The drain of transistor M1 is electrically coupled to the drain of transistor M2 and defines node N1. The source of transistor M2 is coupled to the drain of transistor M3 and defines node N2. The gate of transistor M1 is coupled to RCOM. ADDRESS1 is coupled to the gate of transistor M2; ADDRESS2 is coupled to the gate of transistor M3. The source of transistor M3 is coupled to ADDRESS3. Transistors M2 and M3 function as an address decoder coupled between node N1 and ADDRESS3.

Transistors M4 and M5 are electrically coupled as an inverter 22 between voltage source VDD and ground. The gates of transistors M4 and M5 are electrically coupled to node N1. The drain of transistor M4 is electrically coupled to the drain of transistor M5 and provides the output, ROW. To cause ROW to transition to a logic high, node N I is pulled to a logic low. When node N1 is pulled to a logic high, ROW will transition to a logic low.

As shown in FIG. 1. ROWUP is a signal that is not provided directly to a row driver-decoder. ROWUP is a signal provided to RCOM generating circuit 20. ROWUP typically corresponds to the inverse of the clock signal input to the memory. When the clock is high, ROWUP is low and the memory is in the precharge state as can be seen in FIG. 4. When the clock is low, ROWUP is high and the memory is in the active state at which time one row, the selected row, will transition high. When ROWUP is low such as during the precharge phase, RCOM is low also as can be seen in FIG. 4. No row line will transition high. When ROWUP transitions high, RCOM also transitions high, but no row will transition high on that basis alone. For a row to transition a second condition must also be met. In the selected row driver-decoder, node N1 must also be pulled low by ADDRESS3 and transistors M2 and M3. While RCOM is high, RCOM is a little lower in voltage than a threshold voltage drop down from VDD.

Figure 3:
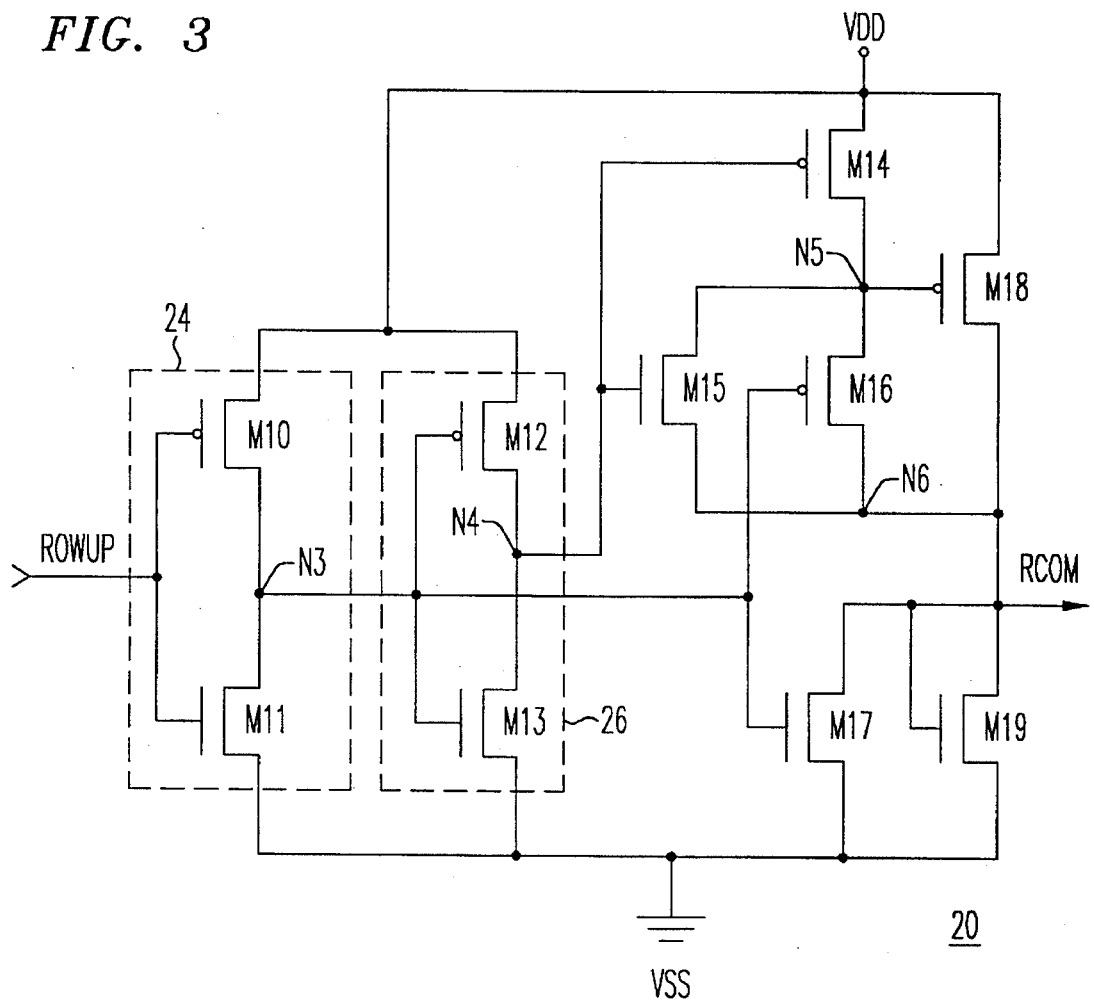
FIG. 3 is a schematic diagram of a circuit for generating the RCOM signal used in FIGS. 1 and 2.
Figure 4A:
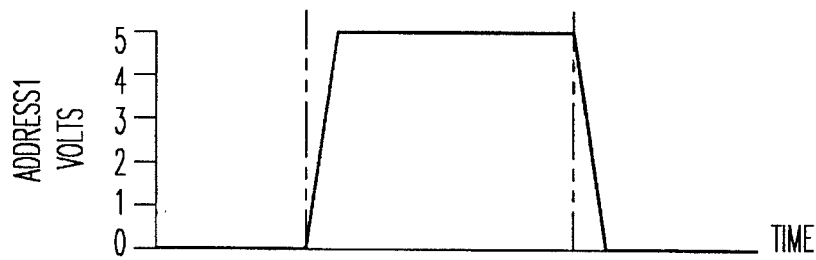
FIGS. 4A through 4F are graphical representations of the voltages appearing at various points in the schematic diagrams of FIGS. 2 and 3, plotted as a function of time.
Figure 4B:
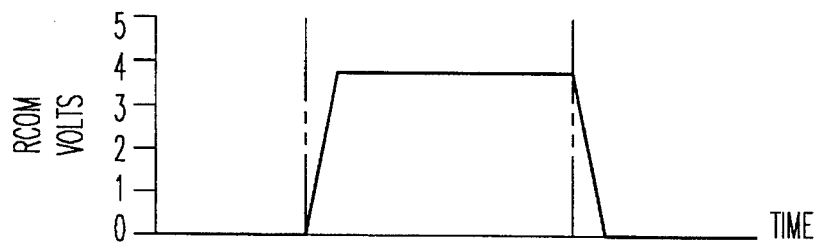
Figure 4C:
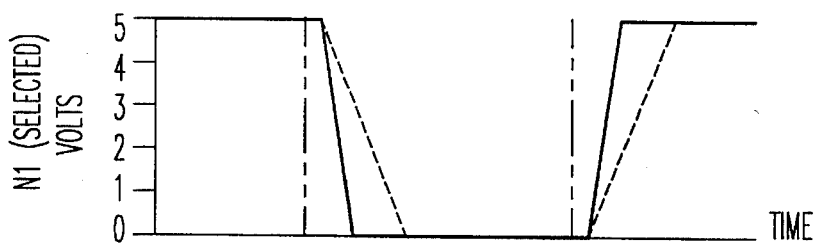
Figure 4D:
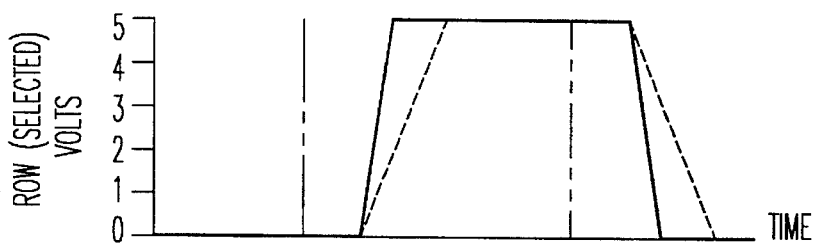
Figure 4E:
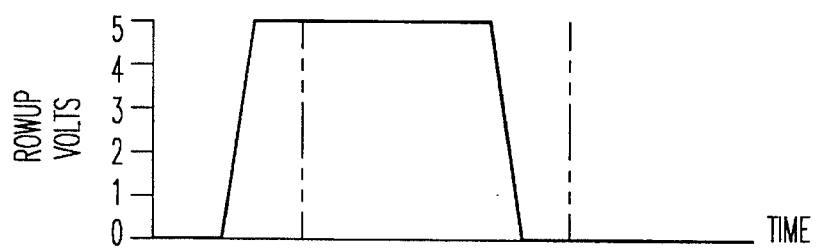
Figure 4F:
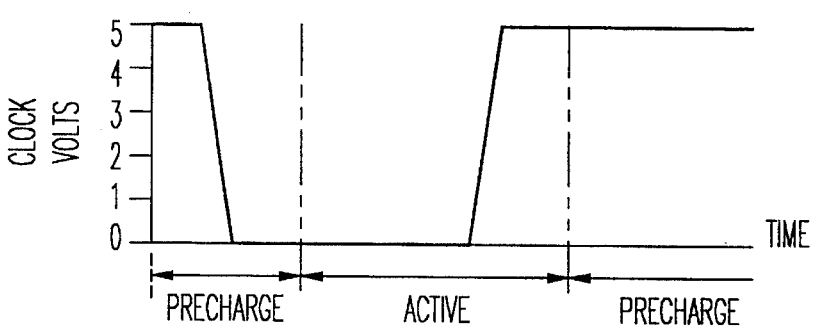

RCOM generating circuit 20 for generating RCOM is shown in greater detail in FIG. 3. In the illustrative embodiment, transistors M10, M12, M14, M16, and M18 are P-channel transistors. Transistors M11, M13, M15, M17 and M19 are N-channel transistors. Transistors M10 and MI 1 are electrically coupled as an inverter 24. The conduction path of transistors M10 and M11 are electrically coupled between VDD and a reference potential VSS, such as ground. The gates of transistors M10 and M11 are electrically coupled to receive ROWUP as the input to inverter 24. The common drains are coupled to node N3 as an output.

Transistors M12 and M13 are electrically coupled as an inverter 26, with the conduction paths of transistors M12 and M13 electrically coupled between VDD and reference potential VSS. The gates of transistors M12 and M13 are electrically coupled to node N3 as the input to inverter 26. The common drains are coupled to node N4 as in output.

The conduction paths of transistors M15 and M16 are electrically coupled in parallel between nodes N5 and N6. The conduction path of transistor M14 is electrically coupled between node N5 and VDD. The conduction path of transistor M19 is electrically coupled between node N6 and potential VSS. The gate of transistor M19 is also coupled to node N6, which provides the output of circuit RCOM. The gate of transistors M14 and M15 are electrically coupled to node N4. The gate of transistor M16 is electrically coupled to node N3. The conduction paths of transistor M17 is coupled between node N6 and reference potential VSS. The gate of transistor M17 is coupled to node N3. The conduction path of transistor M18 is coupled between VDD and node N6.

In order to cause a row line, such as the output of driver-decoder RD 1 driving ROW 1 to transition high, it is necessary to pull node N1 low. What is desired is to have a transistor M1 in the selected row driver-decoder circuit that is turned off during the active portion of the read or write cycle, and during the precharge portion of the cycle provides a large current to node N1 so as to pull node, N1 up rapidly. Ideally, transistor M1 could be switched by a logical combination of the address lines, and in effect could be the output of a three input AND gate. The three inputs to the AND gate could be ADDRESS1, ADDRESS2 and the inverse of ADDRESS3. However, with the constraint that the row driver-decoder circuit must be laid-out on a pitch of one row, there is not sufficient space for a three input AND gate connected as described. An alternative approach must be provided.

In operation, RCOM transitions high during the active portion of a read or write cycle in preparation for a read or write operation. In the high state, RCOM is slightly below one threshold voltage drop below VDD. With reference to FIG. 2, during the active portion of a read and write cycle, when ADDRESS 1 is a logic high, transistor M2 will be turned on. Similarly, when ADDRESS2 is a logic high, transistor M3 will be turned on. If ADDRESS3 is low, that is at ground potential, the combination of ADDRESS1 high, ADDRESS2 high and ADDRESS3 low will electrically couple node N1 to ground, thereby driving node N1 low. When node N1 transitions low, the output of inverter 22 transitions high. The output of inverter 22 is ROW, which is used to raise the voltage level of the row line of memory cells associated with the respective row driver. The operation of transistors M2 and M3 are opposing the operation of transistor M1. Transistor M1 tends to maintain node N1 at the voltage of VDD. RCOM is applied to the gate of transistor M1. Because the gate of transistor M1 is slightly lower than one threshold voltage drop below VDD when RCOM is high, transistor M1 is only slightly conductive and provides very little opposition to the transition of node N1 to ground. Since transistor M1 is only slightly conductive, that is almost off, during the active portion of the cycle, the gain of transistor M1 can be relatively large compared to the prior art where transistor M1 was maintained in the conductive state. Due to the relatively large gain of transistor M1, during the precharge portion of the cycle node N1 can transition high more rapidly, resulting in a relatively rapid transition of the previously selected row line to ground potential. Additionally, during the active portion of the memory access cycle, node N1 of the selected row driver-decoder can transition to ground relatively rapidly, resulting in a more rapid transition high in the selected row line.

RCOM is a signal employed to turn transistor M1 on and off. It is a signal provided to all row decoders as shown in FIG. 1. If the selected row is ROW1, then in the seven row driver-decoders RD2–RD8 associated with the ROW2 through ROW8 that remain at ground potential, transistor M1 in each of the respective row driver-decoder circuits must stay on to maintain node N1 at the potential of VDD. It is only in the row decoder associated with the row to be turned on that transistor M1 can be turned off. In the row driver-decoder that is associated with the row line that is to transition high, node N1 is pulled down toward ground. Since RCOM is common to all eight row drivers, RD1–RD8, in the precharge portion of the read or write cycle, RCOM will be at ground potential. This results in all eight row drivers having transistor M1 turned on. With each transistor M1 turned on, node N1 in each row driver is at a logic high assuring that the respective row output of each row driver is a logic low. However, during the active portion of the read or write cycle when it is desired to have one row at a logic high, signal RCOM is brought up to a voltage level that is slightly lower than one threshold down from VDD. This keeps transistor M1 turned slightly on. In the slightly on state, transistor M1 has a very high resistance. Transistor M1 can be sized to have a larger gain than it had in prior art designs. The larger gain area makes transistor M1 a stronger device so it can provide a larger current to charge the parasitic capacitance and the gate capacitance of transistors M4 and M5. When the gate of transistor M1 is at ground potential, it has a relatively low resistance which pulls node N1 up to the potential VDD rapidly. In the active portion of the read-write cycle, RCOM is raised to a voltage level that is slightly lower than a threshold voltage drop down from VDD. This turns transistor M1 on slightly which means that it will be in a higher resistance state. With transistor M1 in a high resistance state, it is possible to pull node N1 low on the one row select line that is selected to transition to a high voltage and to pull node N1 low very rapidly, which in turn causes the row line to transition high very rapidly. This is shown in the solid line of the timing diagram of FIG. 4. The solid line shows the voltage at node N1 transitioning low more rapidly and the row select line transitioning high more rapidly than the prior art which is illustrated as a broken line. Likewise, in transitioning from the active state into the precharge state, RCOM will transition low, that is back to ground potential. Since RCOM is applied to the gate of transistor M1, this turns transistor M1 on making it a very low resistance and allowing it to pull-up node N1 very rapidly in comparison to the prior art. Node N1 being pulled high very rapidly in turn, through the operation of inverter 22, causes the row line that was addressed to transition to ground potential very rapidly in comparison to the prior art. The row select line transitioning to ground potential is shown as a solid line in FIG. 4 and is compared to the prior art which is shown as a broken line. Transistor M5 when turned on pulls ROW to ground potential.

When ROWUP transitions high, inverter 24 output node N3 transitions low. When node N3 transitions low, node N4 transitions high. Transistors M15 and M16 turn on and off at the same time and are either both on or both off. The reason for both and N-channel device and a P-channel device is to assure that node N5 is at the same potential as RCOM. A P-channel device pulls up a node well, but does not pull a node down well. An N-channel device pulls a node down well but does not pull a node up well. In the arrangement shown in FIG. 3, the best of both functions are achieved with transistors M15 and M16. Transistor M18 is configured as a diode, under certain circumstances. Its gate, node N5, is connected to its drain which is RCOM. That circumstance occurs when transistors M15 and M16 are turned on and transistor M14 is turned off. The voltage provided at node N6 tracks the voltage of signal ROWUP but reaches a maximum amplitude that is slightly more than one voltage threshold drop lower than the voltage of VDD.

While the circuits have been described herein as having transistors of a particular type, it is understood that the circuit functions can be achieved using other types of devices.

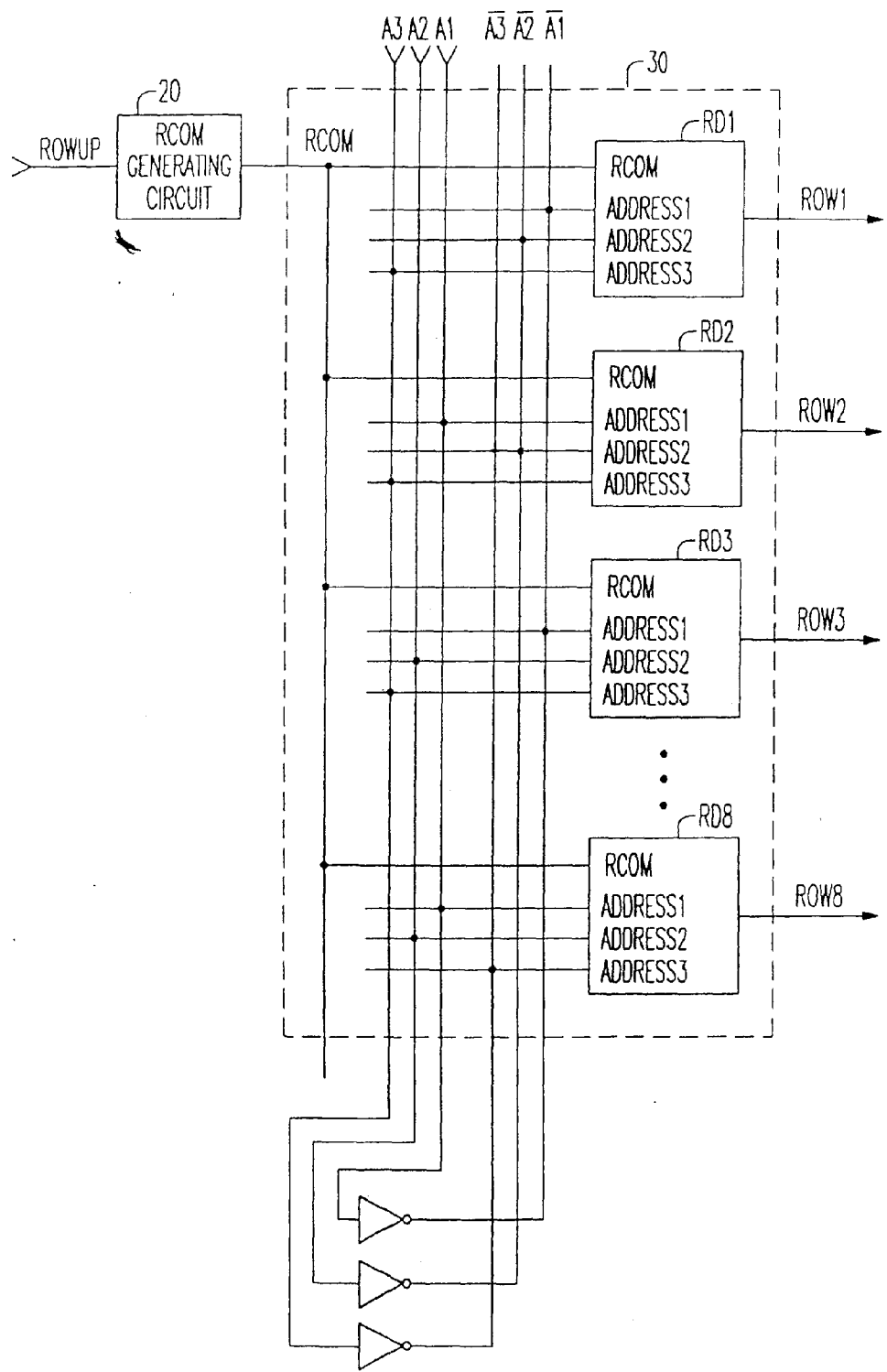

We claim:

1. An integrated circuit, comprising:

a plurality of row decoder-driver circuits each for raising the voltage of a respective row line, each of the plurality of row decoder-driver circuits having an address decoder capable of receiving a plurality of address bits, the plurality address bits when decoded by the address decoder identify one of the plurality of row decoder-drivers to provide an output, each of the plurality of row decoder-drivers having an input transistor having a gate, the input transistor having a conduction path coupled between a power supply node and the address decoder; and a signal generating circuit, the signal generating circuit for receiving a signal to raise the voltage of a respective row line associated with the identified row decoder-driver circuit, the signal generating circuit providing an output that is coupled to the gate of the input transistor of each of the plurality of row decoder-driver circuits, the output maintains the gate of each input transistor near the edge of conduction of said input transistor.

2. An integrated circuit as recited in claim 1, wherein the edge of conduction is one voltage threshold drop below the voltage at the power supply node.

3. An integrated circuit as recited in claim 1, wherein the plurality of address bits is comprised of three bits.

4. An integrated circuit as recited in claim 1 wherein the at least one address decoding transistor is comprised of three transistors.

* * * * *

UNITED STATES PATENT AND TRADEMARK OFFICE
CERTIFICATE OF CORRECTION

PATENT NO.     : 5,534,797
DATED          : July 9, 1996
INVENTOR(S)    : Richard J. McPartland It is certified that error appears in the above-identified patent and that said Letters Patent is hereby corrected as shown below:

Please delete old drawing with new drawing attached.

Signed and Sealed this

Tenth Day of August, 2004

JON W. DUDAS
*Acting Director of the United States Patent and Trademark Office*